(12) United States Patent
Lee

(10) Patent No.: US 7,131,847 B2
(45) Date of Patent: Nov. 7, 2006

(54) TEST APPARATUS HAVING INTERMEDIATE CONNECTION BOARD FOR PACKAGE

(75) Inventor: Jong-Joo Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/001,182

(22) Filed: Dec. 2, 2004

(65) Prior Publication Data
US 2005/0260868 A1 Nov. 24, 2005

(30) Foreign Application Priority Data
May 18, 2004 (KR) ............. 10-2004-0035057

(51) Int. Cl.
H01R 12/00 (2006.01)
H05K 1/00 (2006.01)
(52) U.S. Cl. ......................... 439/66; 439/71
(58) Field of Classification Search .............. 439/66, 439/331, 71, 73
See application file for complete search history.

(56) References Cited

U.S. PATENT DOCUMENTS

| | | | | |
|---|---|---|---|---|
| 3,825,876 A | * | 7/1974 | Damon et al. ............. | 439/70 |
| 5,702,255 A | * | 12/1997 | Murphy et al. ............ | 439/71 |
| 5,880,590 A | * | 3/1999 | Desai et al. .............. | 324/757 |
| 6,036,503 A | * | 3/2000 | Tsuchida ................. | 439/70 |
| 6,050,832 A | * | 4/2000 | Lee et al. ................ | 439/91 |
| 6,064,217 A | * | 5/2000 | Smith ..................... | 324/760 |
| 6,193,524 B1 | * | 2/2001 | Chang .................... | 439/66 |
| 6,293,810 B1 | * | 9/2001 | Goodwin et al. .......... | 439/71 |
| 6,375,476 B1 | * | 4/2002 | Goodwin et al. .......... | 439/71 |
| 2003/0099097 A1 | * | 5/2003 | Mok et al. ............... | 361/767 |
| 2003/0146510 A1 | * | 8/2003 | Chien ..................... | 257/738 |
| 2003/0171011 A1 | * | 9/2003 | Li ......................... | 439/68 |
| 2004/0175966 A1 | * | 9/2004 | Alger et al. ............. | 439/68 |

FOREIGN PATENT DOCUMENTS

| JP | 2002-090417 A | 3/2002 |
|---|---|---|
| KR | 10-2000-0007516 A | 2/2000 |
| KR | 10-2001-0030128 A | 4/2001 |
| KR | 2002-0020350 A | 3/2002 |
| KR | 2002-0052592 A | 7/2002 |

OTHER PUBLICATIONS

Korean Office Action dated Nov. 30, 2005.

* cited by examiner

Primary Examiner—Tulsidas C. Patel
Assistant Examiner—Vladimir Imas
(74) Attorney, Agent, or Firm—Harness, Dickey & Pierce, P.L.C.

(57) ABSTRACT

A test apparatus may include a test socket having socket pins with a standard configuration. An intermediate connection board may be interposed between the test socket and a package that has solder balls with a non-standard configuration. The intermediate connection board may have contact balls and contact pads. The contact balls may be arranged in a configuration that is compatible with the standard socket pin configuration, and the contact pads may be arranged in a configuration that is compatible with the non-standard solder ball configuration.

19 Claims, 6 Drawing Sheets

TEST APPARATUS HAVING INTERMEDIATE CONNECTION BOARD FOR PACKAGE

CROSS REFERENCE TO RELATED APPLICATIONS

This U.S. non-provisional application claims priority under 35 U.S.C. §119 from Korean Patent Application No. 2004-35057, which was filed in the Korean Intellectual Property Office on May 18, 2004, the contents of which are incorporated by reference herein in its entirety.

BACKGROUND OF THE INVENTION

1. Field of the Invention

The present invention relates generally to a test apparatus for a semiconductor device and, more particularly, to a test socket available for ball grid array (BGA) packages.

2. Description of the Related Art

A trend of electronic products may be toward lighter weight, smaller size, higher speed, more functionality, higher performance, better reliability, and/or more cost-effective fabrication. As the trend continues, package assembly technology may become more important. The BGA package may have an array of external terminals, e.g., solder balls, which may be distributed over a chip surface. This may be in contrast to a conventional lead frame package that may have external terminals only at peripheral locations, i.e., at one or more chip edges.

In a BGA package, the distribution of terminal locations may reduce the area occupied by the package when the package is mounted on a motherboard, for example. In this regard, the BGA package may provide for an improved mounting density. Furthermore, the surface-distributed terminals may reduce electrical signal propagation paths within the package, thereby allowing an improvement in electrical characteristics.

BGA packages may have solder balls arranged in standard configurations. The particular standard configuration may depend on a category of the device in which the BGA package is to be implemented. However, advances in modern digital technology may require solder ball configurations in addition to the standard configurations. Such non-standard solder ball configurations may accommodate changes in input/output terminals on the chip and/or modifications in package structures, for example.

Products implementing BGA packages may be subjected to electrical and/or reliability tests, for example. Such tests may employ a test socket that receives the solder balls of the BGA package to provide electrical access to the product. Thus, if the solder ball configuration of the BGA package is changed, then the test socket may also need to be changed to accommodate the BGA package. In addition, the infrastructure related to the tests may also need to be altered and/or rebuilt. Unfortunately, changing the test socket and the infrastructure may impose a heavy burden on package assemblers with regard to time and cost, for example.

SUMMARY OF THE INVENTION

Exemplary, non-limiting embodiments of the present invention may provide a test apparatus for a ball grid array (BGA) package having solder balls with a solder ball configuration.

According to an exemplary embodiment of the present invention, the apparatus may include a test socket having socket pins arranged in a socket pin configuration. The apparatus may also include an intermediate connection board interposed between the test socket and the BGA package to provide electrical paths between the socket pins and the solder balls. The intermediate connection board may include a base body having a top face and a bottom face. Contact balls may be disposed on the bottom face in a configuration that coincides with the socket pin configuration. And contact pads may be disposed on the top face in a configuration that coincides with the solder ball configuration.

According to another exemplary embodiment of the present invention, the intermediate connection board may further include a wiring pattern, which has a lower wiring pattern on the bottom face of the base body and an upper wiring pattern on the top face of the base body. The lower wiring pattern may have ball pads for the contact balls, and the upper wiring pattern may have the contact pads. The lower and the upper wiring patterns may be electrically coupled to each other. Also, the ball pads and the contact pads may be electrically coupled to each other through plated via holes.

According to another exemplary embodiment of the present invention, the intermediate connection board may further include a guide plate, which is disposed over the top face of the base body and has guide holes through which the contact pads are exposed. Each guide hole may taper toward an associated contact pad. The guide plate may have a thickness smaller than the height of the solder ball of the BGA package. Further, the guide plate may be fabricated from an electrically insulating material such as rubber, photo solder resist, or the same material as the base body. Additionally, the guide plate may be covered with an elastic layer.

According to another exemplary embodiment of the present invention, the wiring pattern may further include an internal wiring pattern. The internal wiring pattern may have a ground layer and/or a power layer. Moreover, the intermediate connection board may further include a laminated wiring board. The laminated wiring board may be disposed on the top face of the base body. The laminated wiring board may also include guide holes through which the contact pads are exposed. The laminated wiring board may have at least one-layered wiring pattern and a plating layer electrically connecting the contact pads to the wiring pattern. The wiring pattern may have a ground layer and/or a power layer, one end of which is exposed to the guide hole and electrically coupled to the plating layer.

According to another exemplary embodiment of the present invention, an apparatus for a package having solder bumps arranged in a solder bump configuration may include a socket having socket pins arranged in a socket pin configuration. A body may be mounted on the socket, such that a first surface of the body faces toward the socket and a second surface of the body faces away from the socket. Contact protrusions may be provided on the first surface of the body in a contact protrusion configuration. Contact pads may be provided on the second surface of the body in a contact pad configuration. The contact protrusion configuration may be compatible with the socket pin configuration, and the contact pad configuration may be compatible with the solder bump configuration.

In another exemplary embodiment of the present invention, an intermediate connection board may include a body having a first surface and a second surface. Contact protrusions may be provided on the first surface of the body in a contact protrusion configuration. Contact pads may be provided on the second surface of the body in a contact pad configuration. The contact protrusion configuration may be compatible with a socket pin configuration of a socket, and the contact pad configuration may be compatible with a solder bump configuration of a package.

In another exemplary embodiment of the present invention, an intermediate connection board may have a first surface provided with contact protrusions in a contact protrusion configuration, and a second surface provided with contact pads in a contact pad configuration. The contact protrusion configuration may be compatible with a socket pin configuration of a socket, and the contact pad configuration may be compatible with a solder bump configuration of a package.

In another exemplary embodiment of the present invention, a method for testing a package having solder bumps may involve providing a body having a first surface with contact protrusions and a second surface with contact pads. The body may be mounted on a socket having socket pins so that the contact protrusions electrically connect to the socket pins. The package may be mounted on the body so that the contact pads electrically connect to the solder bumps. The body may electrically connect together the socket and the package.

DETAILED DESCRIPTION OF EXEMPLARY EMBODIMENTS OF THE INVENTION

Figure 1:
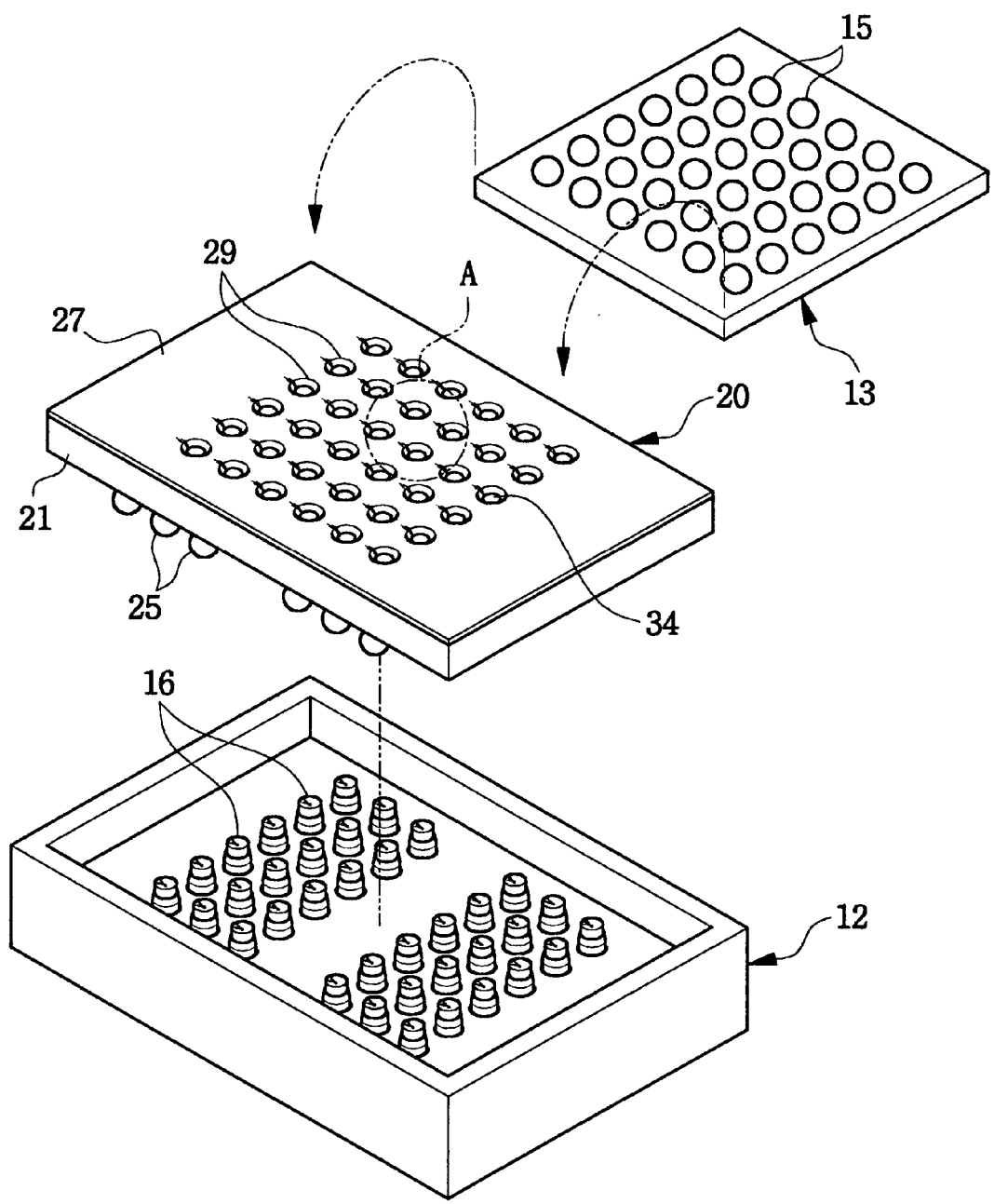
FIG. 1 is an exploded perspective view showing a test apparatus having an intermediate connection board in accordance with an exemplary, non-limiting embodiment of the present invention.

Exemplary, non-limiting embodiments of the present invention will now be described more fully with reference to the accompanying drawings. This invention may, however, be embodied in many different forms and should not be construed as limited to the exemplary embodiments. Rather, the disclosed embodiments are provided so that this disclosure will be thorough and complete, and will fully convey the scope of the invention to those skilled in the art. The principles and feature of this invention may be employed in varied and numerous embodiments without departing from the scope of the invention.

In this disclosure, well-known structures and processes are not described or illustrated in detail to avoid obscuring the present invention. Furthermore, the figures are not drawn to scale. Rather, for simplicity and clarity of illustration, the dimensions of some of the elements may be exaggerated relative to other elements. A layer may be considered as being formed "on" another layer or a substrate when formed either directly on the referenced layer or the substrate or formed on other layers or patterns overlaying the referenced layer or substrate. Like reference numerals are used for like and corresponding parts of the various drawings.

As discussed above, BGA packages may have standard solder ball configurations. Such BGA packages may be referred to as "standard BGA packages." However, some BGA packages have different (or non-standard) solder ball configurations, and such packages may be referred to as "non-standard BGA packages."

Figure 2:
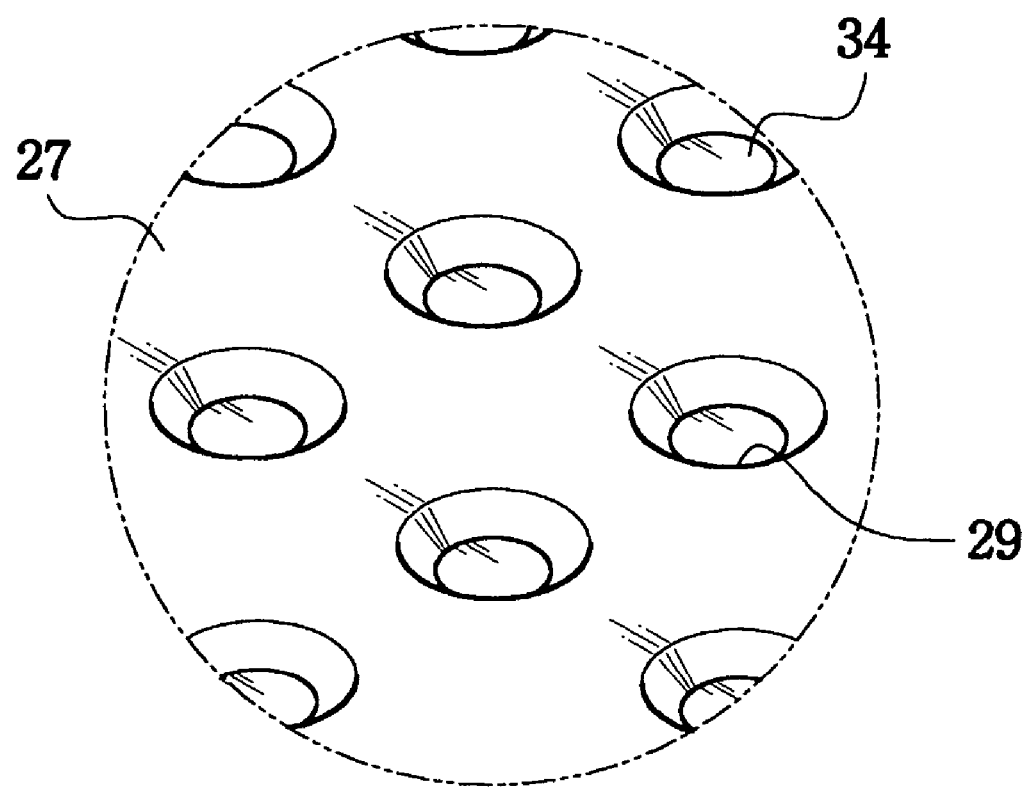
FIG. 2 is an enlarged view of the section "A" in FIG. 1.
Figure 3:
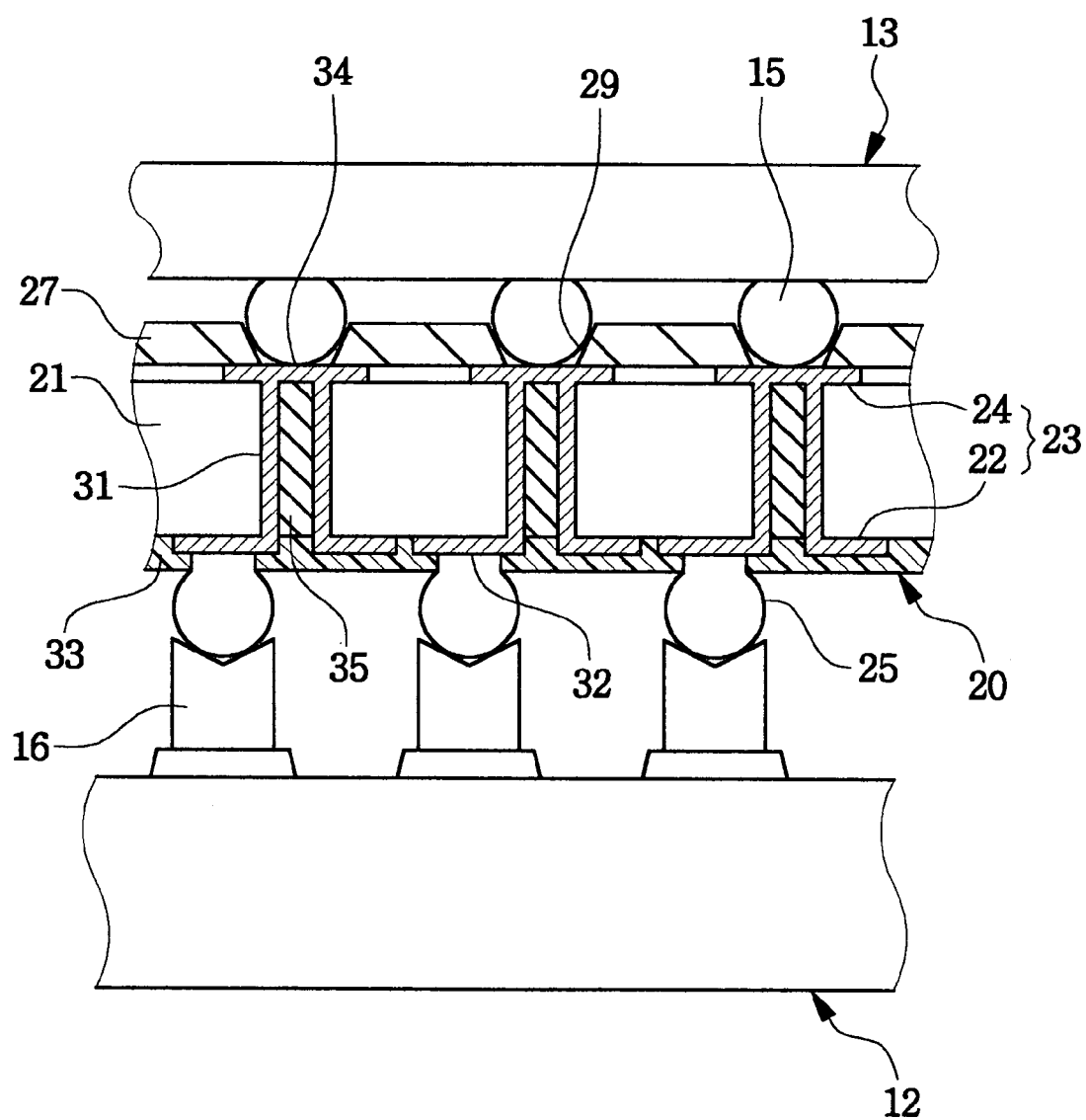
FIG. 3 is a cross-sectional view showing positional relations between a non-standard BGA package and a test socket using the intermediate connection board in FIG. 1.

FIG. 1 shows, in an exploded perspective view, a test apparatus having an intermediate connection board 20 in accordance with a first exemplary, non-limiting embodiment of the present invention. FIG. 2 is an enlarged view of the section "A" in FIG. 1. FIG. 3 is a cross-sectional view showing positional relations between a non-standard BGA package 13 and a test socket 12 using the intermediate connection board 20.

Referring to FIGS. 1 to 3, the test socket 12 may be designed to accommodate standard BGA packages (not shown). In this regard, the test socket 12 may be considered as a "standard" test socket 12. Notwithstanding, the test socket 12 may be employed for testing the non-standard BGA package 13. This may be accomplished via the intermediate connection board 20, which may be interposed between the non-standard BGA package 13 and the test socket 12. The intermediate connection board 20 may provide electrical connections between the non-standard BGA package 13 and the test socket 12.

The intermediate connection board 20 may have a face provided with contact balls 25 and another face provided with contact pads 34. The contact balls 25 may be disposed to correspond with socket pins 16 of the test socket 12, and the contact pads 34 may be disposed to correspond with solder balls 15 of the BGA package 13. Here, the term "correspond" is intended to broadly mean a working relationship, such as an electrical and/or mechanical interconnection. The contact balls 25 and the contact pads 34 may be electrically coupled to each other to provide electrical paths between the socket pins 16 and the solder balls 15.

The intermediate connection board 20 may include a base body 21. The intermediate connection board 20 may be a printed circuit board (PCB) or a ceramic substrate. However, the invention is not limited in this regard as the intermediate connection board 20 may be fabricated from other suitable materials that may be well known in this art. The base body 21 may be fabricated from a material, such as FR-4 prepreg, epoxy resin or ceramic, which may have sufficient mechanical stiffness for maintaining planarity. The base body 21 may be fabricated from other suitable materials that may be well known in this art.

The intermediate connection board 20 may include a wiring pattern 23. The wiring pattern 23 may be of a multilayered structure, inclusive of two individual layers of wiring pattern 22, 24. However, the invention is not limited in this regard since wiring patterns having a different number of wiring pattern layers may be suitably implemented, as will be described below with respect to another example embodiment.

The wiring pattern 23 may be fabricated from copper, for example, or some other suitable material as is well known in this art. The wiring pattern 23 may have a wiring pattern 22 on a face of the base body 21 and a wiring pattern 24 on another, opposite face of the base body 21. The two wiring patterns 22 and 24 may be electrically coupled to each other through plated via holes 31. The plated via holes 31 may be filled with a dielectric material 35. It will be understood, however, that the dielectric material 35 may be altogether omitted.

The wiring pattern 22 may have ball pads 32 on which the contact balls 25 are formed. The contact balls 25 may be arranged in a configuration that is compatible with the configuration of the socket pins 16 of the test socket 12. The term "compatible" is used to broadly indicate that the contact balls 25 are configured to be electrically connectable to the socket pins 16 so that the test socket 12 (via the intermediate connection board 20) may have appropriate electrical access to the non-standard BGA package 13 for testing or some other desired functionality. As shown in FIG. 3, the compatible configuration of the contact balls 25 may result in a one-to-one correspondence between the contact balls 25 and the socket pins 16. However, the invention is not limited in this regard so long as appropriate electrical connections are provided between the test socket 12 and the intermediate connection board 20. Further, as shown in FIG. 3, the contact balls 25 may be superposed (and centered) directly over the socket pins 16. In this regard, the contact balls 25 and the socket pins 16 may have the same configurations (i.e., the two configurations may coincide). However, the invention is not limited in this regard. For example, the contact balls 25 may be offset with respect to the socket pins1 6.

The wiring pattern 24 may include the contact pads 34. The contact pads 34 may be arranged in a configuration that is compatible with the configuration of the solder balls 15 of the non-standard BGA package 13. The term "compatible" is used to broadly indicate that the contact pads 34 are configured to be electrically connectable to the solder balls 15 so that the test socket 12 (via the intermediate connection board 20) may have appropriate electrical access to the non-standard BGA package 13 for testing or some other desired functionality. The compatible configuration may not necessarily result in the one-to-one correspondence between the contact pads 34 and the solder balls 15 shown in FIG. 3, so long as appropriate electrical connections are provided between the intermediate connection board 20 and the non-standard BGA package 13. Further, as shown in FIG. 3, the contact pads 34 may be superposed (and centered) directly below the solder balls 15. In this regard, the contact balls 25 and the socket pins 16 may have the same configurations (i.e., the two configurations may coincide). However, the invention is not limited in this regard. For example, the contact pads 34 may be offset with respect to the solder balls 15.

The intermediate connection board 20 may include a guide plate 27. The guide plate 27 may be disposed on the base body 21. The guide plate 27 may have guide holes 29 through which the contact pads 34 may be exposed. The guide holes 29 may direct the solder balls 15 to the contact pads 34 when the non-standard BGA package 13 is mounted on the intermediate connection board 20. In this way, the package 13 may be self-aligned due to the guide holes 29, even though the package 13 may not be initially mounted with accuracy. To this end, the guide holes 29 may have a cross-sectional profile that tapers toward the contact pads 34. That is, the diameter of the guide hole 29 may decrease as it approaches the contact pad 34. The thickness of the guide plate 27 may be smaller than the height of the solder ball 15.

The guide plate 27 may be fabricated from an electrically insulating material, such as rubber, photo solder resist, or the same material as the base body 21. The guide plate 27 may be fabricated from other suitable materials that may be well known in this art. Further, the guide plate 27 may be adhered, coated, attached, laminated, or otherwise provided on the base body 21. In some applications, the guide plate 27 may be covered with an elastic layer (not shown) of rubber or photo solder resist, for example. The elastic layer may reduce the likelihood of the package 13 experiencing mechanical damages or electrical shorts. The elastic layer may resiliently support the package 13, which may be relatively delicate particularly for wafer level packages, when a pressure may be applied to the package 13 so as to achieve reliable contact with the socket pins 16. As an alternative, a wiring board may be attached to the base body 21 as a substitute for the guide plate 27.

The contact balls 25 may be fabricated from solder material or some other suitable material that may be well known in this art. The contact balls 25 may have the substantially same dimensions as the solder balls of the standard BGA package. Further, the configuration of the contact balls 25 may follow the configuration of the solder balls of the standard BGA package. In addition, for reliable contact with the test socket 12, parts of the intermediate connection board 20 may have the substantially same structures as parts of the standard BGA package. For example, a face of the base body 21 may be coated with a solder mask 33 for protecting the wiring pattern 22. The solder mask 33 may be made of photo solder resist, or some other suitable material that may be well known in this art. As shown in FIGS. 1 and 3, the contact balls 25 and the solder balls 15 may have a generally spherical shape. It will be appreciated, however, that the invention is not limited in this regard since contact balls 25 and solder balls 15 having varied and alternative geometric shapes may be suitably implemented.

The test socket 12 having the socket pins 16 may be widely known in this art and therefore a detailed description of the same is omitted. The socket pin 16 may be of a pogo pin type, for example. However, it will be appreciated that socket pins of alternative pin types may be suitably implemented.

As discussed above, the intermediate connection board 20 may be used for connecting the test socket 12 and the non-standard BGA package 13, both of which may be different from each other in pin and/or ball configurations. The intermediate connection board 20 may be placed on the test socket 12 such that the contact balls 25 are in contact with the socket pins 16. The non-standard BGA package 13 may be mounted on the intermediate connection board 20 such that the solder balls 15 are in contact with the contact pads 34. In some application, pressure may be applied onto the package 13.

The contact pads 34 of the intermediate connection board 20 may be arranged to correspond to the solder balls 15 of the non-standard BGA package 13. It may therefore be possible to employ the existing, standard test socket 12 to test the non-standard BGA package 13. Moreover, it may be unnecessary to change or rebuild the existing test infrastructure including the test socket to test the non-standard BGA package 13.

As discussed above, the configuration of the contact balls 25 may be compatible with the configuration of the socket pins 16, and the configuration of the contact pads 34 may be compatible with the configuration of the solder balls 15 of the package 13. If the solder ball configuration of the package is varied, then the pad configuration of the intermediate connection board may also be varied to maintain compatibility.

Figure 4:
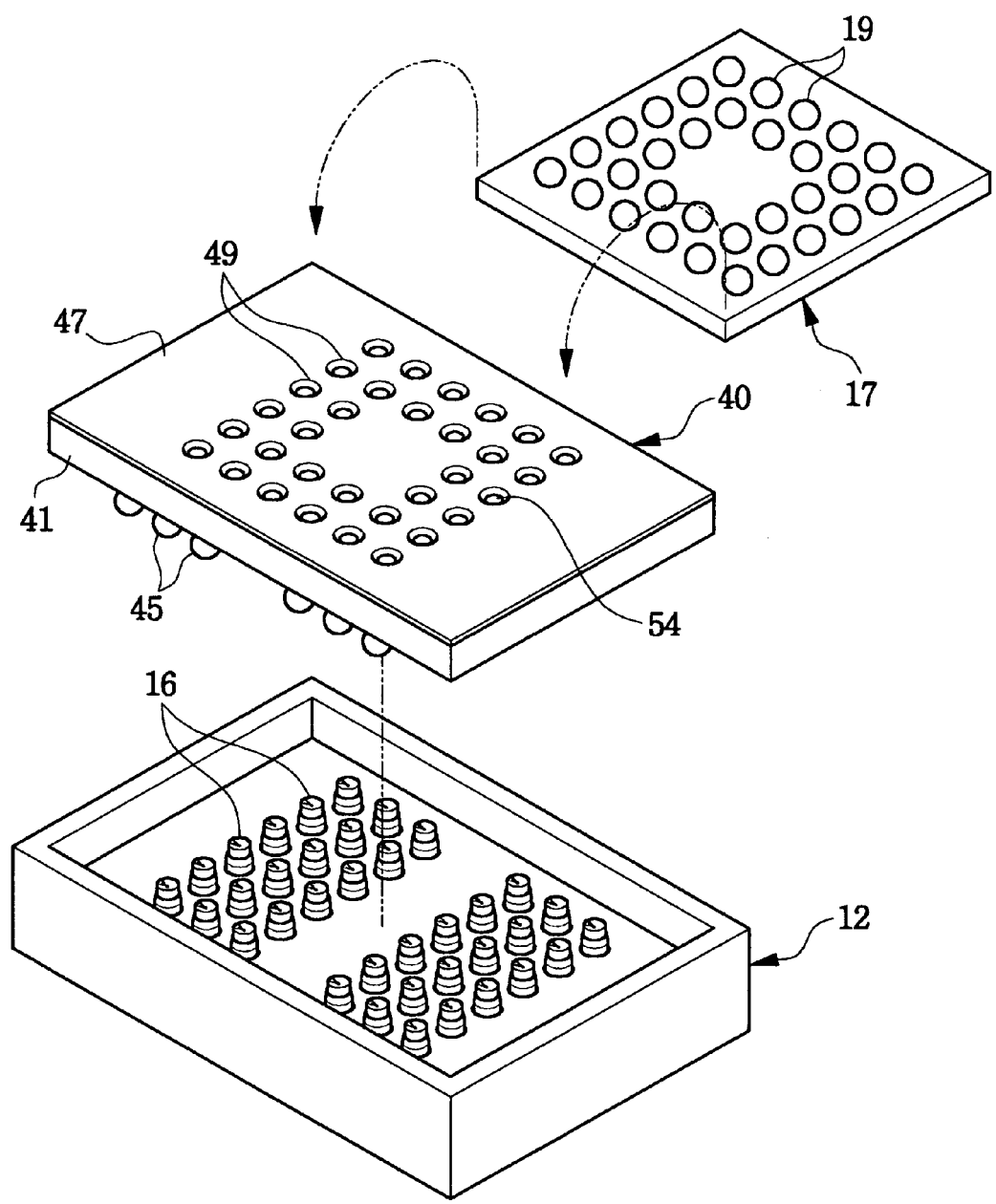
FIG. 4 is an exploded perspective view showing a test apparatus having an intermediate connection board in accordance with another exemplary, non-limiting embodiment of the present invention.
Figure 5:
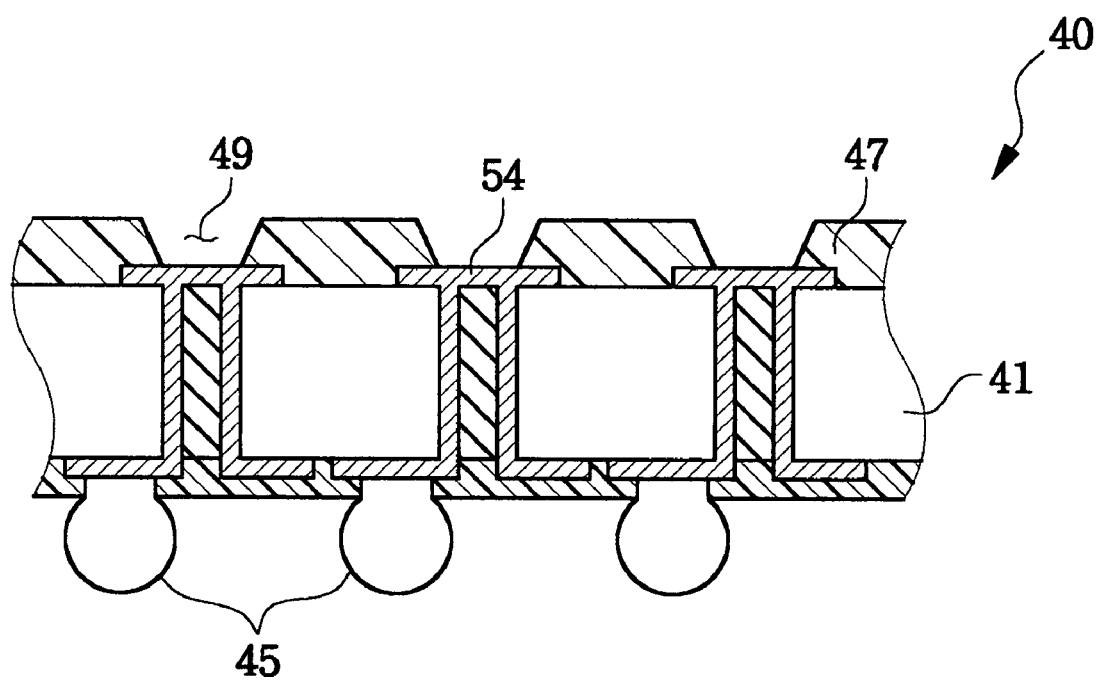
FIG. 5 is a cross-sectional view showing the intermediate connection board in FIG. 4.

FIG. 4 shows, in an exploded perspective view, a test apparatus having an intermediate connection board 40 in accordance with another exemplary, non-limiting embodiment of the present invention. FIG. 5 is a cross-sectional view showing the intermediate connection board 40 in FIG. 4.

The non-standard BGA package 17 of FIG. 4 may have solder balls 19 that are configured differently than the solder balls of the non-standard BGA package 13 of FIG. 1. Therefore, the intermediate connection board 40 of FIGS. 4 and 5 may have contact pads 54 that are configured differently that the contact pads of the intermediate connection board 20 of FIGS. 1 to 3. However, since the test socket 12 may be standardized, the intermediate connection board 40 shown in FIGS. 4 and 5 may have the same configuration of contact balls 45 as the intermediate connection board 20 of FIGS. 1 to 3.

Figure 6:
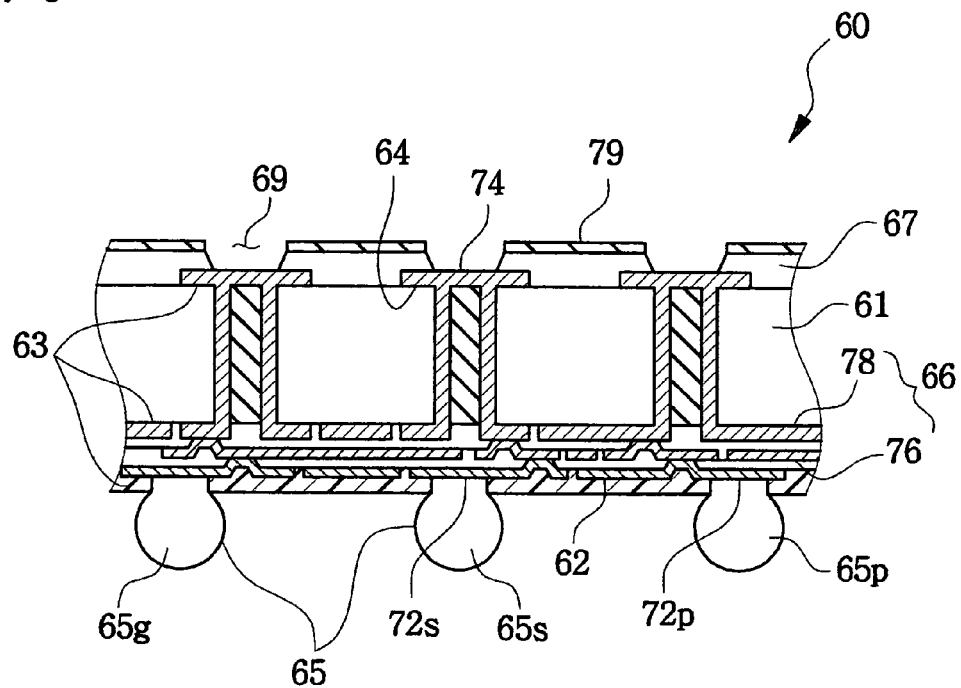
FIG. 6 is a cross-sectional view showing an intermediate connection board in accordance with another exemplary, non-limiting embodiment of the present invention.

In an alternative, example embodiment, the intermediate connection board may have a ground layer and a power layer that may improve power delivery noise characteristics. An example, non-limiting embodiment of such features is shown in FIG. 6. FIG. 6 is a cross-sectional view of an intermediate connection board 60 in accordance with another exemplary, non-limiting embodiment of the present invention.

Referring to FIG. 6, the intermediate connection board 60 may have a ground layer 76 and a power layer 78 formed on a face of a base body 61. Specifically, a wiring pattern 63 may have two surface wiring patterns 62, 64. These surface wiring patterns 62, 64 may be respectively similar to the wiring patterns 22, 24 depicted in FIG. 3 to the extent that they may provide ball pads (for supporting contact balls 65g, 65s, 65p) and contact pads 74 (for supporting solder balls). The wiring pattern 63 may also include a two-layered internal wiring pattern 66 composed of the ground layer 76 and the power layer 78.

The ground layer 76 may be electrically coupled to ground contact balls 65g, and the power layer 78 may be electrically coupled to power contact balls 65p. The ground layer 76 and the power layer 78 may be patterned so as to be electrically isolated from the other parts of the wiring pattern 63 that may be coupled to signal contact balls 65s. As shown in FIG. 6, the power layer 78 may be interposed between the ground layer 76 and the base body 61. However, the invention is not limited in this regard since the ground layer 76 and the power layer 78 may be provided in alternative positions. For example, the ground layer 76 may be interposed between the power layer 78 and the base body 61. Additionally, the wiring pattern 62 (except for the signal ball pads 72s and the power ball pads 72p) may be used for the ground layer.

A face of the base body 61 may be covered with a guide plate 67. The guide plate 67 may have guide holes 69. An elastic layer 79 may be provided on the guide plate 67.

Figure 7:
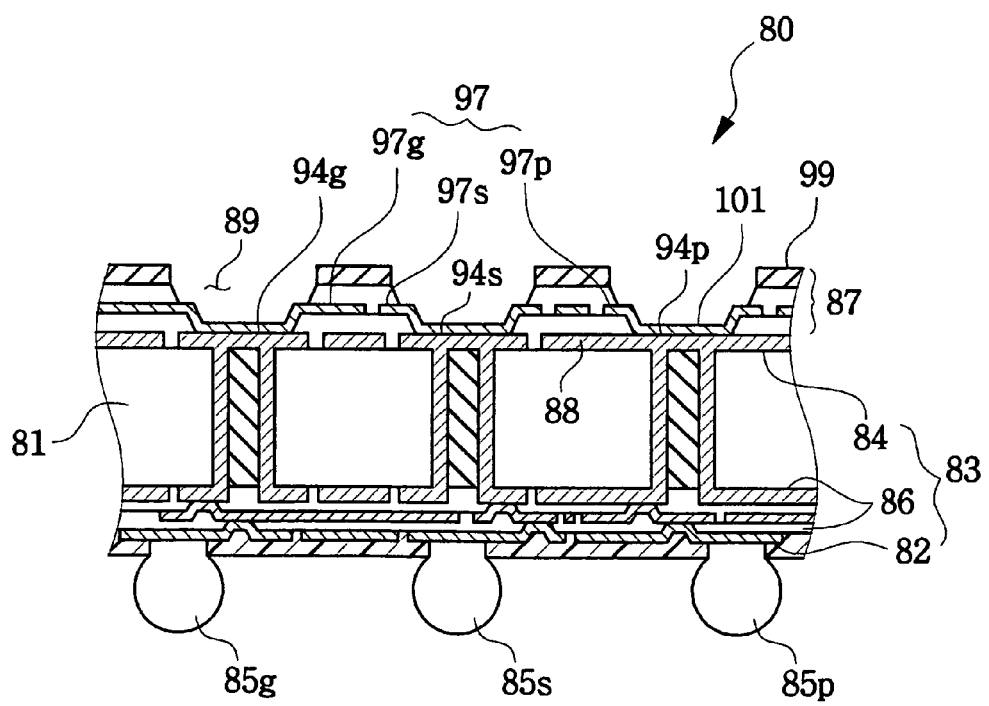
FIG. 7 is a cross-sectional view showing an intermediate connection board in accordance with another exemplary, non-limiting embodiment of the present invention.

A ground layer and a power layer may also be formed on the base body as shown in FIG. 7. FIG. 7 shows in a cross-sectional view an intermediate connection board 80 in accordance with another exemplary, non-limiting embodiment of the present invention.

Referring to FIG. 7, another ground layer 97g and another power layer 88 may be disposed on a face of a base body 81. The ground layer 97g may be formed in a laminated wiring board 87, which may be attached to the base body 81. The laminated wiring board 87 may serve as a guide plate. Therefore, the wiring board 87 may have guide holes 89 and an elastic layer 99.

The wiring board 87 may have a single-layered wiring pattern 97 including the ground layer 97g, the power layer 97p and a signal layer 97s. The wiring pattern 97 may be exposed to sidewalls of the guide holes 89. A plating layer 101 may electrically connect the contact pads 94g, 94p and 94s to the wiring pattern 97. The wiring pattern 84 may be used for the power layer 88, which may be electrically isolated from the ground contact pads 94g and the signal contact pads 94s.

While this invention has been particularly shown and described with reference to exemplary embodiments thereof, it will be understood by those skilled in the art that various changes in form and details may be implemented without departing from the spirit and scope of the invention as defined by the appended claims.

What is claimed is:

1. A test apparatus for a ball grid array (BGA) package having solder balls arranged in a solder ball configuration, the apparatus comprising:
    a test socket having socket pins arranged in a socket pin configuration; and
    an intermediate connection board interposed between the test socket and the BGA package to provide electrical paths between the socket pins and the solder balls, the intermediate connection board including
        a base body having a top face and a bottom face;
        contact balls disposed on the bottom face in a configuration that coincides with the socket pin configuration; and
        contact pads disposed on the top face in a configuration that coincides with the solder ball configuration;
    the configuration of the contact balls and the configuration of the contact pads exhibiting different patterns.

2. The apparatus of claim 1, wherein the intermediate connection board further includes a wiring pattern having a lower wiring pattern on the bottom face of the base body and an upper wiring pattern on the top face of the base body, the lower wiring pattern having ball pads for the contact balls, the upper wiring pattern having the contact pads, and the lower and the upper wiring patterns being electrically coupled to each other.

3. The apparatus of claim 2, wherein the ball pads and the contact pads are electrically coupled to each other through plated via holes.

4. The apparatus of claim 1, wherein the intermediate connection board further includes a guide plate disposed on the top face of the base body and having guide holes through which the contact pads are exposed.

5. The apparatus of claim 4, wherein each of the guide holes tapers toward an associated contact pad.

6. The apparatus of claim 4, wherein the guide plate has a thickness smaller than a height of the solder ball of the BGA package.

7. The apparatus of claim 4, wherein the guide plate is fabricated from an electrically insulating material.

8. The apparatus of claim 7, wherein the guide plate is fabricated from one of rubber, photo solder resist, and the same material as the base body.

9. The apparatus of claim 4, wherein the guide plate is covered with an elastic layer.

10. The apparatus of claim 2, wherein the wiring pattern further includes an internal wiring pattern having at least one of a ground layer and a power layer.

11. The apparatus of claim 1, wherein the intermediate connection board further includes a laminated wiring board disposed on the top face of the base body and having guide holes through which the contact pads are exposed.

12. The apparatus of claim 11, wherein the laminated wiring board includes at least one-layered wiring pattern.

13. The apparatus of claim 12, wherein the laminated wiring board includes a plating layer electrically connecting the contact pads to the wiring pattern.

14. The apparatus of claim 13, wherein the wiring pattern includes at least one of a ground layer and a power layer, one end of which is exposed to the guide hole and electrically coupled to the plating layer.

15. An apparatus for a package having solder bumps arranged in a solder bump configuration, the apparatus comprising:
   a socket having socket pins arranged in a socket pin configuration;
   a body mounted on the socket, such that a first surface of the body faces toward the socket and a second surface of the body faces away from the socket;
   contact protrusions provided on the first surface of the body in a contact protrusion configuration; and
   contact pads provided on the second surface of the body in a contact pad configuration;
   wherein the contact protrusion configuration is compatible with the socket pin configuration;
   wherein the contact pad configuration is compatible with the solder bump configuration; and
   wherein the contact protrusion configuration and the contact pad configuration exhibiting different patterns.

16. An intermediate connection board comprising:
   a body having a first surface and a second surface;
   contact protrusions provided on the first surface of the body in a contact protrusion configuration; and
   contact pads provided on the second surface of the body in a contact pad configuration;
   wherein the contact protrusion configuration is compatible with a socket pin configuration of a socket;
   wherein the contact pad configuration is compatible with a solder bump configuration of a package; and
   wherein the contact protrusion configuration and the contact pad configuration exhibit different patterns.

17. An intermediate connection board having a first surface provided with contact protrusions in a contact protrusion configuration, and a second surface provided with contact pads in a contact pad configuration,
   wherein the contact protrusion configuration is compatible with a socket pin configuration of a socket, and the contact pad configuration is compatible with a solder bump configuration of a package; and
   wherein the contact protrusion configuration and the contact pad configuration exhibit different patterns.

18. A method for testing a package having solder bumps, the method comprising:
   providing a body having a first surface with contact protrusions in a first configuration and a second surface with contact pads in a second configuration, the first and the second configurations exhibiting different patterns;
   mounting the body on a socket having socket pins so that the contact protrusions electrically connect to the socket pins; and
   mounting the package on the body so that the contact pads electrically connect to the solder bumps;
   wherein the body electrically connects together the socket and the package.

19. An apparatus for performing the method of claim 18.

* * * * *